(12) United States Patent
Furuta et al.

(10) Patent No.: US 7,671,458 B2
(45) Date of Patent: Mar. 2, 2010

(54) CONNECTING MEMBER USED FOR SEMICONDUCTOR DEVICE INCLUDING PLURALITY OF ARRANGED SEMICONDUCTOR MODULES AND SEMICONDUCTOR DEVICE PROVIDED WITH THE SAME

(75) Inventors: Norifumi Furuta, Toyota (JP); Noriyuki Masuda, Kasugai (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 685 days.

(21) Appl. No.: 11/367,272

(22) Filed: Mar. 6, 2006

(65) Prior Publication Data

US 2006/0226450 A1 Oct. 12, 2006

(30) Foreign Application Priority Data

Mar. 28, 2005 (JP) ............................. 2005-091973

(51) Int. Cl.
*H01L 23/02* (2006.01)

(52) U.S. Cl. .............................. 257/686; 257/E25.023; 257/685; 257/734; 257/208; 361/382; 361/386

(58) Field of Classification Search .......... 257/E25.027, 257/208, 734, E25.023, 685, 686, 706, 707, 257/723, 725, 777; 361/386, 382, 385, 412
See application file for complete search history.

(56) References Cited

U.S. PATENT DOCUMENTS

| | | | | |
|---|---|---|---|---|
| 5,173,838 A | * | 12/1992 | Wessely | 361/716 |
| 5,367,436 A | * | 11/1994 | Ikei | 361/766 |
| 5,383,787 A | * | 1/1995 | Switky et al. | 439/67 |
| 5,526,275 A | * | 6/1996 | Enomoto | 716/4 |
| 5,768,497 A | * | 6/1998 | Uemura et al. | 714/28 |
| 6,428,327 B1 | * | 8/2002 | Tamarkin et al. | 439/67 |
| 6,574,115 B2 | * | 6/2003 | Asano et al. | 361/775 |
| 6,603,077 B2 | * | 8/2003 | Hirai | 174/78 |
| 6,750,672 B2 | * | 6/2004 | Tanimura et al. | 324/765 |
| 7,014,472 B2 | * | 3/2006 | Fjelstad et al. | 439/65 |
| 7,307,293 B2 | * | 12/2007 | Fjelstad et al. | 257/200 |
| 7,394,665 B2 | * | 7/2008 | Hamasaki et al. | 361/803 |
| 2004/0094328 A1 | * | 5/2004 | Fjelstad et al. | 174/251 |

FOREIGN PATENT DOCUMENTS

| | | |
|---|---|---|
| JP | U-02-042468 | 3/1990 |
| JP | U-02-075771 | 6/1990 |

(Continued)

OTHER PUBLICATIONS

Dec. 1, 2009 Office Action issued in Japanese Patent Application No. 2005-091973 (with translation).

*Primary Examiner*—Chris C Chu
(74) *Attorney, Agent, or Firm*—Oliff & Berridge, PLC

(57) ABSTRACT

A connector includes a fitting hole into which a signal line is fitted, a tapered portion formed to lead a tip portion of the signal line to the fitting hole, and a bonded portion for bonding the connector to a control substrate. The tapered portion has a tapered shape on a side where the signal line is inserted. The tapered shape is tilted from a peripheral portion of the tapered portion to the fitting hole in a direction along which the signal line is inserted, with the fitting hole set as a center.

10 Claims, 10 Drawing Sheets

FOREIGN PATENT DOCUMENTS

| | | |
|---|---|---|
| JP | U-03-110769 | 11/1991 |
| JP | A 05-198986 | 8/1993 |
| JP | A-06-290982 | 10/1994 |
| JP | A 09-260585 | 10/1997 |
| JP | A 10-189168 | 7/1998 |
| JP | A 11-233910 | 8/1999 |
| JP | A 2001-308237 | 11/2001 |
| JP | A 2001-308245 | 11/2001 |
| JP | A-2005-045186 | 2/2005 |
| JP | A-2005-073373 | 3/2005 |
| WO | WO-2005/020276 A2 | 3/2005 |

* cited by examiner

82A

82B

CONNECTING MEMBER USED FOR SEMICONDUCTOR DEVICE INCLUDING PLURALITY OF ARRANGED SEMICONDUCTOR MODULES AND SEMICONDUCTOR DEVICE PROVIDED WITH THE SAME

This nonprovisional application is based on Japanese Patent Application No. 2005-091973 filed with the Japan Patent Office on Mar. 28, 2005, the entire contents of which are hereby incorporated by reference.

BACKGROUND OF THE INVENTION

1. Field of the Invention

The present invention relates to a connecting member and a semiconductor device, and particularly to a connecting mechanism used in connecting each of a plurality of arranged semiconductor modules to a control device via a signal line.

2. Description of the Background Art

A vehicle system such as a hybrid vehicle or an electric vehicle has attracted much attention in recent years. In such a vehicle system, many power semiconductor elements are used in an electronic component such as an inverter or a converter.

In these vehicle systems, a plurality of power semiconductor elements and coolers are alternately arranged from viewpoints of space saving and efficient cooling, so that the above-described electronic component such as an inverter or a converter is formed (hereinafter such a configuration is referred to as a "semiconductor stack").

Japanese Patent Laying-Open No. 09-260585 discloses a configuration of such a semiconductor stack in which a plurality of flat semiconductor elements to be cooled from both sides and coolants are alternately arranged.

The semiconductor stack is assembled such that a plurality of power semiconductor elements and a plurality of coolers, which have alternately been arranged, are pressed from both sides in a direction along which the power semiconductor elements and the coolers are arranged. When the semiconductor stack is to be assembled, there occur positional variations in each of the power semiconductor elements inside the semiconductor stack in a direction along which the power semiconductor elements are arranged, because of design tolerances of each of the power semiconductor elements and each of the coolers.

A signal line extends from each of the plurality of power semiconductor elements for receiving a signal from and transmitting a signal to a control device. Each signal line is fitted into a connector of the control device disposed adjacently to the semiconductor stack.

Because of positional variations in each of the power semiconductor elements inside the semiconductor stack in a direction along which the power semiconductor elements are arranged, a signal line cannot easily be fitted into a connector, conventionally resulting in that assemblability of the semiconductor device is deteriorated.

To reduce positional variations in each of the power semiconductor elements inside the semiconductor stack in a direction along which the power semiconductor elements are arranged, it is contemplated, for example, to improve dimensional accuracy in each of the power semiconductor elements and each of the coolers, or use other techniques to reduce positional tolerances in each of the power semiconductor elements. However, reduction in positional tolerances can cause increase in manufacturing cost. Cost reduction is highly demanded by a vehicle system such as a hybrid vehicle, and hence it is desired to improve assemblability of the semiconductor device with a simpler technique.

The above-described Japanese Patent Laying-Open No. 09-260585 aims to reduce outer dimensions of the semiconductor stack in an assembled state. However, this document fails to consider such a problem of assemblability of the semiconductor device.

SUMMARY OF THE INVENTION

The present invention is made to overcome the problem above. An object of the present invention is to provide a connecting member capable of improving assemblability of a semiconductor device having a configuration of a semiconductor stack.

Another object of the present invention is to provide a semiconductor device having a configuration of a semiconductor stack and capable of improving assemblability with a simple technique.

According to the present invention, a connecting member is a connecting member connecting each of a plurality of signal lines disposed between a plurality of arranged semiconductor modules and a control device driving the plurality of semiconductor modules, to either of the control device and the corresponding semiconductor module, and includes: a fitting portion formed to be fitted to the corresponding signal line; and a leading portion formed to lead a tip portion of the corresponding signal line to the fitting portion.

Furthermore, according to the present invention, a semiconductor device includes: a plurality of arranged semiconductor modules; a control device disposed along the plurality of arranged semiconductor modules and driving the plurality of semiconductor modules; a plurality of signal lines disposed between the plurality of semiconductor modules and the control device, respectively; and a plurality of connecting members connecting the plurality of signal lines to either of the control device and the plurality of semiconductor modules, respectively, and each of the plurality of connecting members includes a fitting portion formed to be fitted to the corresponding signal line, and a leading portion formed to lead a tip portion of the corresponding signal line to the fitting portion.

Preferably, the leading portion has a tapered shape formed in a periphery of the fitting portion and tilted from a peripheral portion of the leading portion to the fitting portion in a direction along which the corresponding signal line is inserted.

Preferably, the leading portion has a magnetized portion formed adjacently to a periphery of the fitting portion and generating attractive force toward the tip portion of the corresponding signal line.

In the present invention, a semiconductor stack is formed of a plurality of arranged semiconductor modules. In the semiconductor stack, there occur positional variations in each of the semiconductor modules in a direction along which the semiconductor modules are arranged because of design tolerances of each of the plurality of arranged semiconductor modules, and others. Owing to the positional variations in each of the semiconductor modules, when the semiconductor stack and a control device are to be assembled, misalignment occurs between a signal line and a fitting portion of a connecting member to which the signal line is connected.

As to the misalignment between the signal line and the fitting portion in assembling a semiconductor device having a configuration of such a semiconductor stack, a leading portion of the connecting member leads a tip portion of a corresponding signal line to the fitting portion. Therefore, according to the present invention, assemblability of the semiconductor device having a configuration of the semiconductor stack can be improved with a simple technique.

Preferably, the tip portion of each of the plurality of signal lines is magnetized to generate attractive force toward the magnetized portion.

In the semiconductor device, attractive force between a magnetized portion of the leading portion and a tip portion of the signal line is further increased. Therefore, according to the semiconductor device, the tip portion of the signal line can be led to the fitting portion more securely.

Preferably, the tip portion of each of the plurality of signal lines has a tapered shape.

In the semiconductor device, a frictional resistance at a contact portion between a tip portion of the signal line and the connecting member is reduced, and hence the tip portion of the signal line is smoothly led to the fitting portion. Therefore, according to the semiconductor device, the tip portion of the signal line can reliably be led to the fitting portion.

Preferably, the semiconductor device further includes a guide portion formed to lead the tip portion of the corresponding signal line along a direction along which the corresponding signal line is inserted, the corresponding signal line penetrating the fitting portion.

In the semiconductor device, a guide portion of the connecting member leads a tip portion of the signal line along a direction along which the signal line is inserted, the tip portion of the corresponding signal line protruding from a rear side of the connecting member. Therefore, according to the semiconductor device, warpage of a signal line can be prevented.

Preferably, each of the plurality of signal lines has at least two bent portions.

In the semiconductor device, one bent portion corrects misalignment between a tip portion of the signal line and the fitting portion, and other bent portions correct an orientation of the tip portion of the signal line to a direction along which the signal line is inserted into the fitting portion. Therefore, according to the semiconductor device, a tip portion of the signal line can be fitted into the fitting portion without causing any warpage of the signal line.

Preferably, a direction along which the plurality of signal lines are made to extend is different from a direction along which the plurality of arranged semiconductor modules are stacked.

More preferably, the direction along which the plurality of signal lines are made to extend is approximately perpendicular to the direction along which the plurality of arranged semiconductor modules are stacked.

As described above, according to the present invention, assemblability in assembling a semiconductor stack having a plurality of semiconductor modules arranged thereon and a control device is improved. Furthermore, it is possible to improve assemblability of a semiconductor device having a configuration of a semiconductor stack with a simple technique using a connecting member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
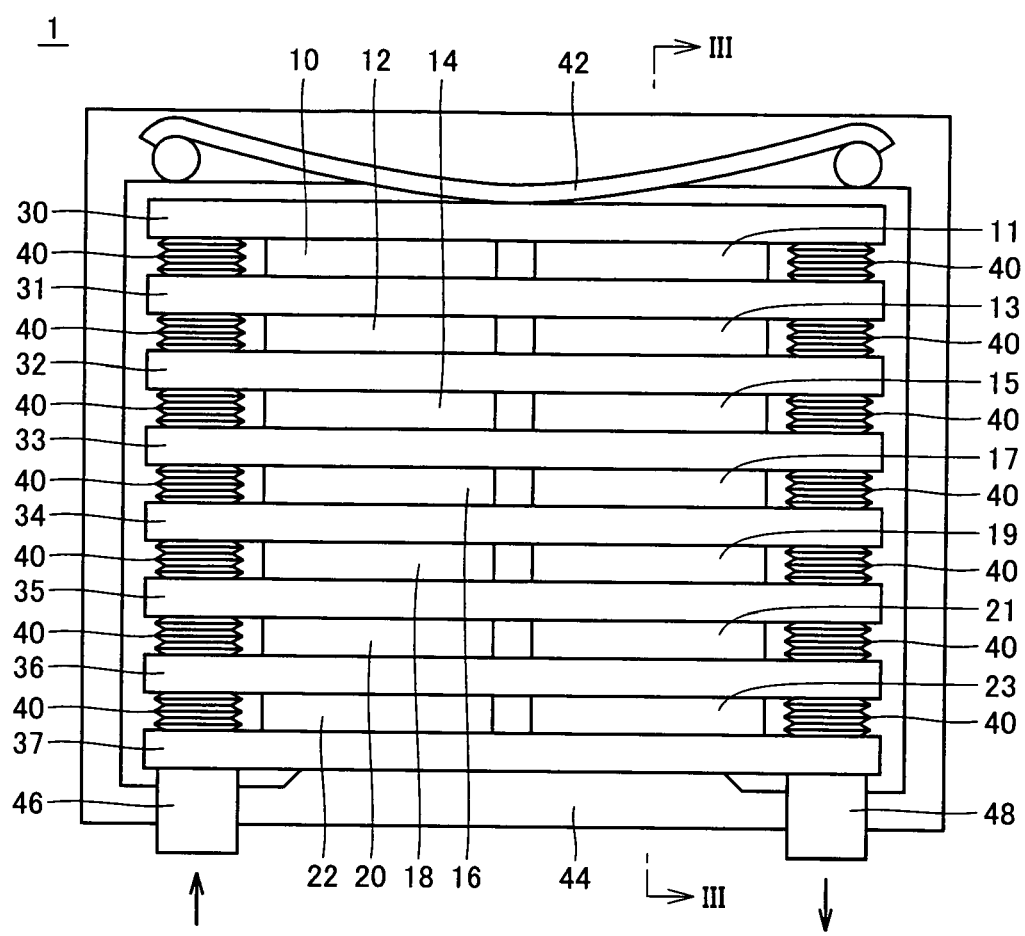
FIG. 1 is a plan view showing a configuration of a semiconductor device according to a first embodiment of the present invention.

The embodiments of the present invention will hereinafter be described in detail with reference to the drawings. The same or corresponding portions in the drawings are provided with the same reference characters, and the description thereof will not be repeated.

First Embodiment

Figure 3:
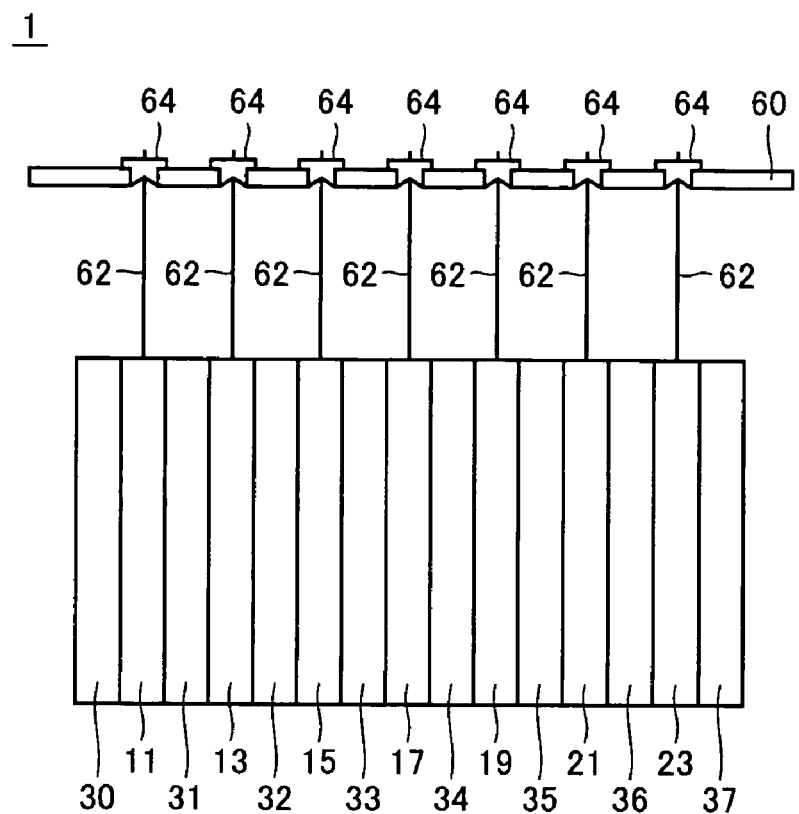
FIG. 3 is a cross section of the semiconductor device shown in FIG. 1 along a plane III-III.

FIG. 1 is a plan view showing a configuration of a semiconductor device according to a first embodiment of the present invention. As described below, a control substrate is disposed at the semiconductor device in the front space of the drawing. However, it is not shown in FIG. 1 for the convenience of explanation. The control substrate is shown in FIG. 3, which will be described below.

Referring to FIG. 1, a semiconductor device 1 includes semiconductor modules 10-23, coolers 30-37, a plurality of water flow pipes 40, a plate spring 42, a housing 44, an inlet 46, and an outlet 48.

Each of semiconductor modules 10-23 is a type of semiconductor module to be cooled from both sides. In each of the semiconductor modules, a power semiconductor element embedded therein is cooled from both sides. Semiconductor modules 10-23, which are aligned into two rows, and coolers 30-37 are alternately arranged. Each of semiconductor modules 10-23 is cooled from both sides by coolers adjacent thereto.

Each of coolers 30-37 is made of a metal member having a high thermal conductivity, such as aluminium. Coolers 30-37 and semiconductor modules 10-23 are alternately arranged, and the coolers 30-37 cool semiconductor modules 10-23 from both sides with cooling water flowing through themselves.

The plurality of water flow pipes 40 are disposed on both sides of arranged semiconductor modules 10-23 between the coolers adjacent in a direction along which the coolers are arranged. Each of the plurality of water flow pipes 40 has a bellows structure extendable and retractable in a direction along which semiconductor modules 10-23 and coolers 30-37 are arranged. The plurality of water flow pipes 40 are water flow paths for allowing cooling water, which is taken in from inlet 46 and taken out from outlet 48, to reach coolers 30-37.

Plate spring 42 is brought into tight contact with cooler 30 disposed at an end portion of the semiconductor stack formed of semiconductor modules 10-23 and coolers 30-37, so as to generate a pressing force in a direction along which the components of the semiconductor stack are arranged. In other words, cooler 37, which is disposed at an end portion different from the end portion where cooler 30 of the semiconductor stack is disposed, is brought into contact with housing 44, and the pressing force generated by plate spring 42 causes the semiconductor stack to be pressed in the direction along which the components of the semiconductor stack are arranged. Housing 44 is made of a metal member with a certain stiffness, such as aluminium or iron.

In semiconductor device 1, semiconductor modules 10-23 and coolers 30-37 are alternately arranged, and pressed from both sides by plate spring 42 in the direction along which the semiconductor modules and the coolers are arranged, so as to form a semiconductor stack. Accordingly, each of semiconductor modules 10-23 and coolers adjacent thereto are brought into tight contact, which improves resistance to vibration and coolability of semiconductor device 1.

Figure 2:
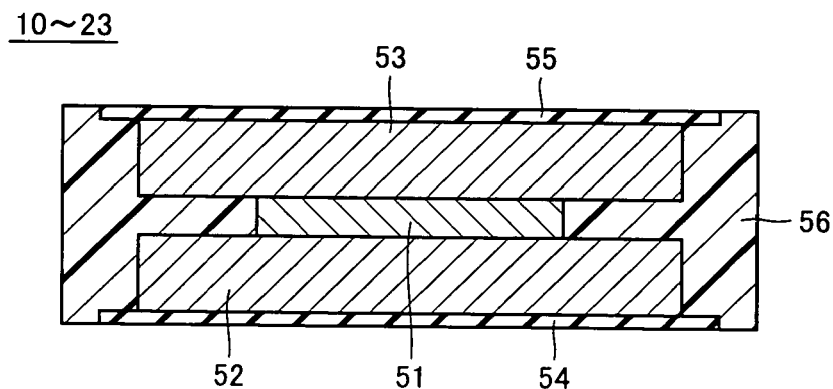
FIG. 2 is a cross section schematically showing a configuration of each of semiconductor modules shown in FIG. 1.

FIG. 2 is a cross section schematically showing a configuration of each of semiconductor modules 10-23 shown in FIG. 1. Referring to FIG. 2, each of semiconductor modules 10-23 includes a semiconductor element 51, electrodes 52, 53, insulating plates 54, 55, and a molded resin 56.

Semiconductor element 51 is a power element such as a power transistor or a diode. Electrodes 52, 53 are disposed to sandwich semiconductor element 51 from both sides. Electrodes 52, 53 are made of a conductor, such as copper, having a high heat transfer property. Electrodes 52, 53 also serve as a heat sink that transmits heat generated at semiconductor element 51 to a cooler.

Insulating plates 54, 55 are provided to insulate electrodes 52, 53 from coolers adjacent thereto (not shown). Molded resin 56 seals semiconductor element 51, electrodes 52, 53, and insulating plates 54, 55.

FIG. 3 is a cross section of semiconductor device 1 shown in FIG. 1 along a plane III-III. In FIG. 3, plate spring 42 and housing 44 are not shown. Referring to FIG. 3, semiconductor device 1 includes a semiconductor stack formed of semiconductor modules 10-23 (semiconductor modules 10, 12, 14, 16, 18, 20, and 22 are not shown, the same applies below) and coolers 30-37, a control substrate 60, a plurality of signal lines 62, and a plurality of connectors 64.

Control substrate 60 is a control device for controlling semiconductor modules 10-23. Control substrate 60 is disposed along the direction along which the components of the semiconductor stack are arranged, and connected to semiconductor modules 10-23 in the semiconductor stack via the plurality of connectors 64 and the plurality of signal lines 62.

The plurality of signal lines 62 are made of a conductor, such as aluminium or copper. The plurality of signal lines 62 are made to extend from semiconductor modules 10-23, respectively, in a direction different from the direction along which the semiconductor modules and the coolers are stacked (e.g. in a direction approximately perpendicular to the direction along which the semiconductor modules and the coolers are stacked, as shown in the drawing), and connected to the plurality of connectors 64, respectively. The plurality of signal lines 62 transmit a control signal and other various kinds of signals between control substrate 60 and semiconductor modules 10-23.

The plurality of connectors 64 are made of a conductor, such as copper. The plurality of connectors 64 are disposed at control substrate 60 at prescribed positions opposite to the signal lines extending from semiconductor modules 10-23 in the semiconductor stack, respectively. Each of the plurality of connectors 64 electrically connects corresponding signal line 62, which has been fitted thereinto, to wiring of control substrate 60.

Figure 4:
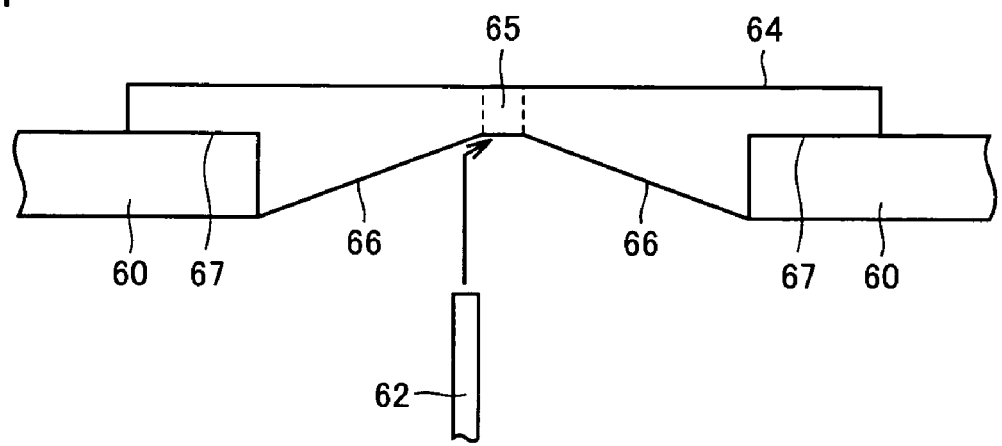
FIG. 4 is an enlarged view of a connector shown in FIG. 3.
Figure 5:
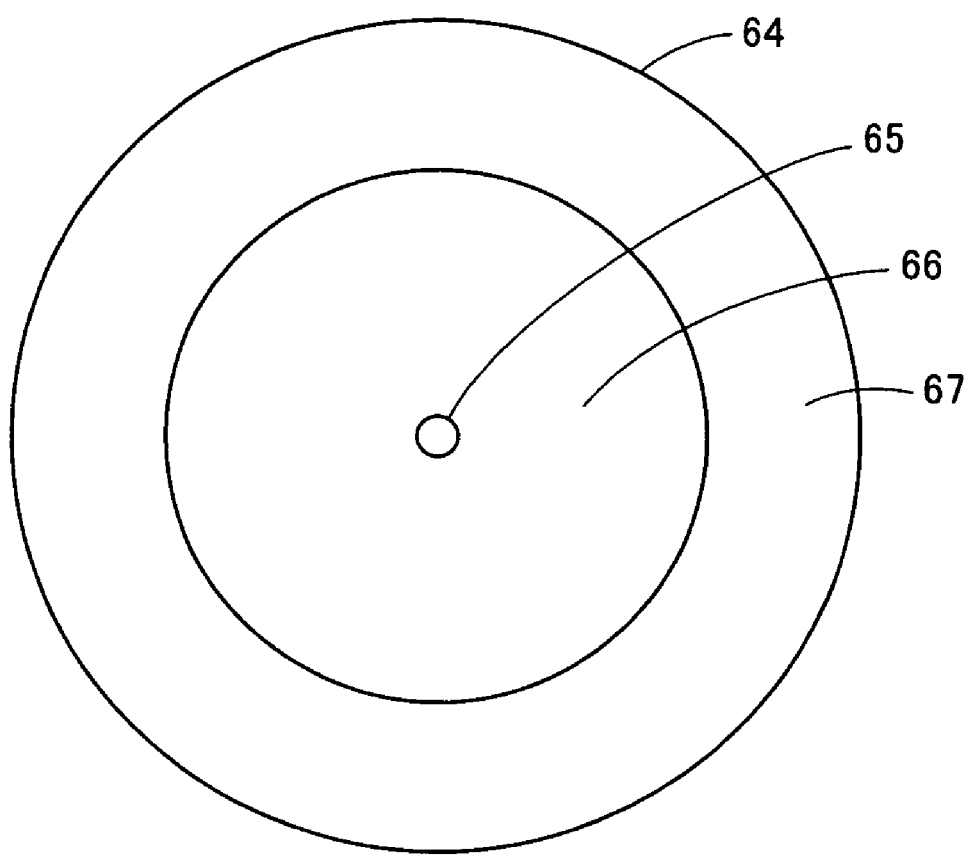
FIG. 5 is a plan view of the connector shown in FIG. 4.

FIG. 4 is an enlarged view of connector 64 shown in FIG. 3. FIG. 5 is a plan view of connector 64 shown in FIG. 4. Referring to FIGS. 4 and 5, connector 64 includes a fitting hole 65, a tapered portion 66, and a bonded portion 67. Fitting hole 65 is a hole into which a tip portion of signal line 62 is inserted and fitted. Tapered portion 66 has a tapered shape on a side where signal line 62 is inserted. The tapered shape is made to tilt in a direction along which signal line 62 is inserted, from a peripheral portion of the tapered portion 66 to fitting hole 65, with fitting hole 65 set as a center. Bonded portion 67 is a portion that electrically connects connector 64 to prescribed wiring of control substrate 60, and is fixed to control substrate 60 with a solder or the like.

As described above, misalignment can occur at semiconductor modules 10-23 with respect to a direction along which semiconductor modules 10-23 are arranged, because of design tolerances, distortion generated when plate spring 42 presses the semiconductor stack, and the like. Owing to the misalignment of semiconductor modules 10-23, further misalignment occurs between the plurality of connectors 64 each disposed at a prescribed position of control substrate 60 and the plurality of signal lines 62 extending from semiconductor modules 10-23.

At connector 64, tapered portion 66 having the tapered shape described above is formed. Therefore, even if signal line 62 misaligned with respect to fitting hole 65 of connector 64, the tapered shape allows a tip portion of signal line 62, which has been brought into contact with tapered portion 66, to be led along the tapered shape to fitting hole 65.

The size of tapered portion 66 is determined based on allowable positional tolerances of semiconductor modules 10-23.

Although the planar shape of connector 64 and its tapered portion 66 have been described as approximately circular, the planar shape of connector 64 and/or its tapered portion 66 may be polygonal (e.g. rectangular).

Figure 6:
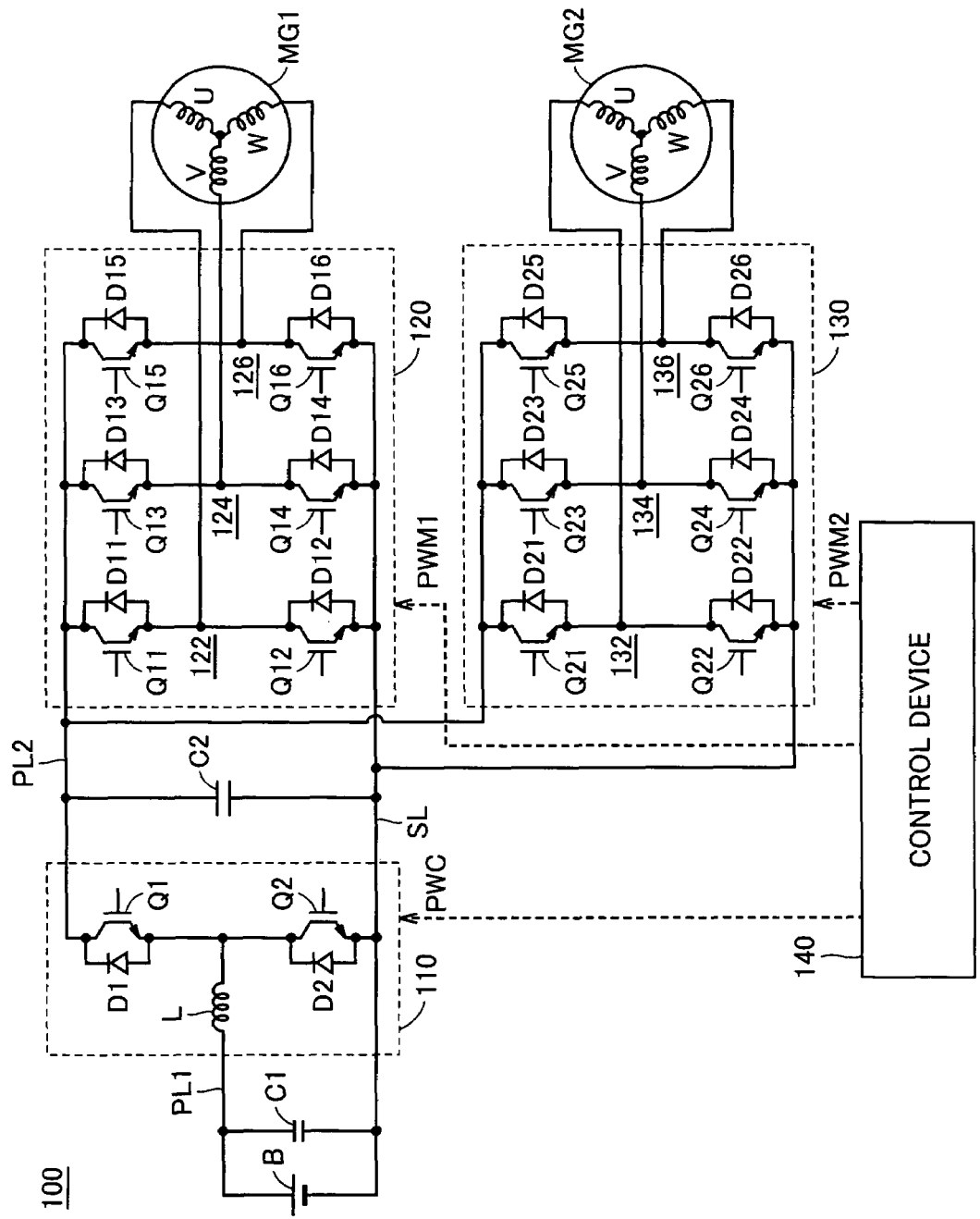
FIG. 6 is a schematic block diagram of a load driving device to which the semiconductor device shown in FIG. 1 is applied.

FIG. 6 is a schematic block diagram of a load driving device to which semiconductor device 1 shown in FIG. 1 is applied. Referring to FIG. 6, a load driving device 100 includes a battery B, a boost converter 110, inverters 120, 130, a control device 140, capacitors C1, C2, power supply lines PL1, PL2, and a ground line SL.

Load driving device 100 is mounted to, for example, a hybrid vehicle. A motor generator MG1 is incorporated into the hybrid vehicle for serving as a generator that is driven by an engine (not shown, the same applies below), while a motor generator MG2 is incorporated into the hybrid vehicle for serving as an electric motor that drives drive wheels (not shown, the same applies below) of the hybrid vehicle.

Each of motor generators MG1, MG2 is an electric rotating machine, for example, a three-phase alternating synchronous electric generator. Motor generator MG1 uses an output of the engine to generate a three-phase alternating voltage, and outputs the generated three-phase alternating voltage to inverter 120. In addition, motor generator MG1 receives a three-phase alternating voltage from inverter 120 and thereby generates a driving force and starts the engine. Motor generator MG2 receives a three-phase alternating voltage from inverter 130 and thereby generates a driving torque of the vehicle. In addition, motor generator MG2 generates a three-phase alternating voltage during regenerative braking of the vehicle and outputs the same to inverter 130.

Battery B, which is a direct current power supply, is a rechargeable and dischargeable battery, for example, a secondary battery such as a nickel metal hydride battery or a lithium-ion battery. Battery B outputs a generated direct-current voltage to boost converter 110, and is charged by a direct-current voltage output from boost converter 110.

Boost converter 110 includes a reactor L, power transistors Q1, Q2, and diodes D1, D2. Reactor L has one end connected to power supply line PL1, and the other end connected to a connecting point of power transistors Q1, Q2. Power transistors Q1, Q2 are made of, for example, an Insulated Gate Bipolar Transistor (IGBT). Power transistors Q1, Q2 are connected in series between power supply line PL2 and ground line SL, and receive a signal PWC from control device 140 at their bases. Diodes D1, D2 are connected between collectors and emitters of power transistors Q1, Q2, respectively, so as to flow a current from the emitters to the collectors.

Inverter 120 includes a U-phase arm 122, a V-phase arm 124, and a W-phase arm 126. U-phase arm 122, V-phase arm 124, and W-phase arm 126 are connected in parallel between power supply line PL2 and ground line SL. U-phase arm 122 is made of power transistors Q11, Q12 connected in series, V-phase arm 124 is made of power transistors Q13, Q14 connected in series, and W-phase arm 126 is made of power transistors Q15, Q16 connected in series. Each of power transistors Q11-Q16 is made of, for example, an IGBT. Diodes D11-D16 are connected between collectors and emitters of power transistors Q11-Q16, respectively, so as to flow a current from the emitters to the collectors. Connecting points of power transistors in the U, V and W-phase arms are connected to coil ends of the U, V and W-phase coils of motor generator MG1, respectively, the coil ends being on the sides opposite to neutral points of the U, V and W-phase coils.

Inverter 130 has a configuration similar to that of inverter 120, and includes a U-phase arm 132, a V-phase arm 134, and a W-phase arm 136. U-phase arm 132 is made of power transistors Q21. Q22 connected in series. V-phase arm 134 is made of power transistors Q23, Q24 connected in series, and W-phase arm 136 is made of power transistors Q25, Q26 connected in series. Diodes D21-D26 are connected between collectors and admitters of power transistors Q21-Q26. respectively, so as to flow the current from the admitters to the collectors. Connecting points of power transistors in the U, V and W-phase arms are connected to coil ends of the U, V and W-phase coils of motor generator MG2, respectively, the coil ends being on the sides opposite to neutral points of the U, V and W-phase coils.

Boost converter 110 and inverters 120, 130 are made into modules on an upper arm-by-upper arm basis and on a lower arm-by-lower arm basis, with respect to an upper arm and a lower arm of boost converter 110, upper and lower arms of U, V and W-phase arms of inverters 120, 130. The semiconductor modules and the coolers are alternately arranged to form the semiconductor stack shown in FIG. 1.

Capacitor C1 is connected between power supply line PL1 and ground line SL to equalize voltage fluctuations between power supply line PL1 and ground line SL. Capacitor C2 is connected between power supply line PL2 and ground line SL to equalize voltage fluctuations between power supply line PL2 and ground line SL.

Boost converter 110 multiplies a direct-current voltage supplied from battery B through power supply line PL1 and outputs the same to power supply line PL2. Specifically, based on signal PWC from control device 140, boost converter 110 multiplies a direct-current voltage from battery B by storing in reactor L, as magnetic field energy, a current flowing in accordance with a switching operation of power transistor Q2, and outputs the multiplied voltage to power supply line PL2 via diode D1 in synchronization with the timing when power transistor Q2 is turned off. Furthermore, based on signal PWC from control device 140, boost converter 110 reduces a direct-current voltage received from inverter 120 and/or 130 through power supply line PL2 to a voltage level of battery B so as to charge battery B.

Based on a signal PWM1 from control device 140, inverter 120 converts the three-phase alternating voltage, which is generated by motor generator MG1 when motor generator MG1 receives an output from the engine, into a direct-current voltage, and outputs the converted direct-current voltage to power supply line PL2. Furthermore, based on signal PWM1 from control device 140, inverter 120 converts a direct-current voltage supplied from power supply line PL2, into a three-phase alternating voltage, and drives motor generator MG1. Motor generator MG1 is thereby driven to generate a torque specified by a torque command value.

Based on a signal PWM2 from control device 140, inverter 130 converts a direct-current voltage supplied from power supply line PL2 into a three-phase alternating voltage to drive motor generator MG2. Motor generator MG2 is thereby driven to generate a torque specified by a torque command value. Furthermore, based on signal PWM2 from control device 140, and during regenerative braking of the hybrid vehicle, inverter 130 converts the three-phase alternating voltage, which is generated by motor generator MG2 when motor generator MG2 receives a turning force from drive wheels, into a direct-current voltage, and outputs the converted direct-current voltage to power supply line PL2.

Control device 140 corresponds to control substrate 60 shown in FIG. 3. Control device 140 generates signal PWC for driving boost converter 110 based on a torque command value and a motor rotational speed of each of motor generators MG1, MG2, the torque command value and the motor rotational speed being output from an Electronic Control Unit (ECU) externally provided and not shown, a battery voltage of battery B, and a voltage between power supply line PL2 and ground line SL. Control device 140 then outputs the generated signal PWC to boost converter 110 via signal line 62 shown in FIG. 3.

Furthermore, control device 140 generates signal PWM1 for driving motor generator MG1 based on a voltage between power supply line PL2 and ground line SL, and a motor current and a torque command value of motor generator MG1, and then outputs the generated signal PWM1 to inverter 120 via signal line 62 shown in FIG. 3. Furthermore, control device 140 generates signal PWM2 for driving motor generator MG2 based on a voltage between power supply line PL2 and ground line SL, and a motor current and a torque command value of motor generator MG2, and then outputs the generated signal PWM2 to inverter 130 via signal line 62 shown in FIG. 3.

First Modification of First Embodiment

Figure 7:
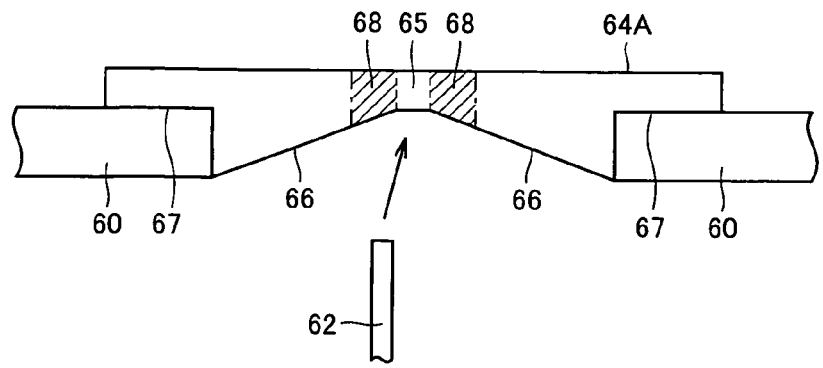
FIG. 7 is an enlarged view of a connector according to a first modification of the first embodiment of the present invention.
Figure 8:
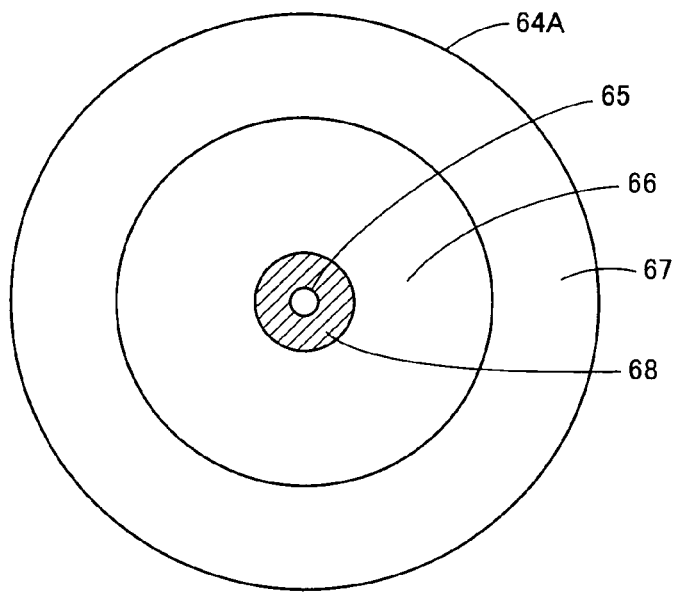
FIG. 8 is a plan view of the connector shown in FIG. 7.

FIG. 7 is an enlarged view of a connector according to a first modification of the first embodiment of the present invention. FIG. 8 is a plan view of the connector shown in FIG. 7. Referring to FIGS. 7 and 8, a connector 64A, which has the configuration of connector 64 shown in FIG. 3, further includes a magnetized portion 68.

Magnetized portion 68 is formed adjacently to the periphery of fitting hole 65. Magnetized portion 68 generates attractive force toward signal line 62, which is a conductor, so as to lead a tip portion of signal line 62 to fitting hole 65. The attractive force allows the tip portion of signal line 62 to be led to fitting hole 65 more securely.

Magnetized portion 68 may be formed by directly magnetizing an area located adjacently to the periphery of fitting hole 65 of tapered portion 66, or alternatively, by embedding another member such as a permanent magnet into the area located adjacently to the periphery of fitting hole 65 of tapered portion 66.

Second Modification of First Embodiment

Figure 9:
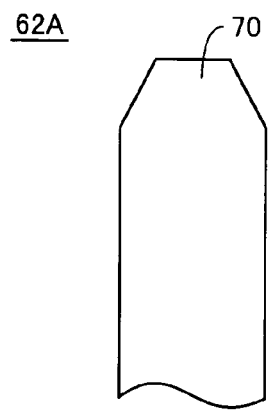
FIG. 9 is a view showing the shape of a tip portion of a signal line in a second modification of the first embodiment of the present invention.

FIG. 9 is a view showing the shape of a tip portion of a signal line according to a second modification of the first embodiment of the present invention. Referring to FIG. 9, a signal line 62A has a tip portion 70 whose corner is trimmed so that tip portion 70 is formed into a convex shape.

When signal line 62A is brought into contact with tapered portion 66 of connector 64 for being led to fitting hole 65, the convex shape allows tip portion 70 of signal line 62A to be led smoothly to fitting hole 65.

Third Modification of First Embodiment

Figure 10:
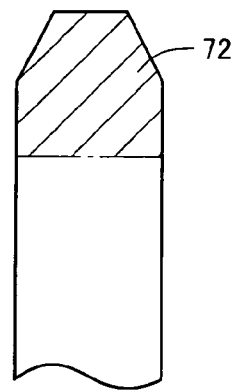
FIG. 10 is a view showing a tip portion of a signal line in a third modification of the first embodiment of the present invention.

FIG. 10 is a view showing a tip portion of a signal line according to a third modification of the first embodiment of the present invention. Referring to FIG. 10, a signal line 62B has a tip portion 72 formed into a convex shape and magnetized as well. Connector 64A shown in FIG. 7 is used as a corresponding connector.

Accordingly, stronger attractive force due to a magnetic force is generated between magnetized tip portion 72 of signal line 62B and magnetized portion 68 of connector 64A, which allows tip portion 72 of signal line 62B to be led to fitting hole 65 much more securely.

Figure 11:
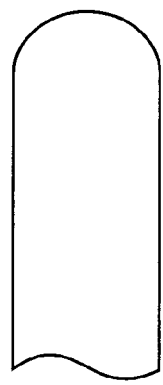
FIG. 11 is a view showing a modification of a signal line according to the first embodiment.
Figure 12:
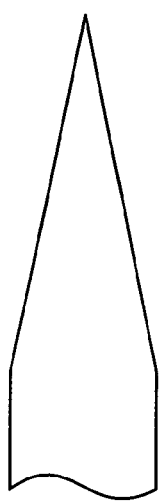
FIG. 12 is a view showing another modification of the signal line according to the first embodiment.

As another modification of the first embodiment, a tip portion of the signal line may be formed into a spherical shape, as in a signal line 62C shown in FIG. 11, while a tip portion of the signal line may be formed into a needle shape, as in a signal line 62D shown in FIG. 12. When the tip portion of each of signal lines 62C, 62D is brought into contact with tapered portion 66 of connector 64 for being led to fitting hole 65, these shapes also allows the tip portions of signal lines 62C, 62D to be led smoothly to fitting hole 65.

As described above, according to the first embodiment and its modifications, even if misalignment occurs between signal lines 62, 62A-62D and fitting portion 65 when semiconductor device 1 is assembled, signal lines 62, 62A-62D are led by tapered portion 66 or magnetized portion 68 to fitting portion 65. Accordingly, there is no need to make efforts of leading signal lines 62, 62A-62D to fitting portion 65 and hence assemblability of semiconductor device 1 can be improved with a simple configuration.

Second Embodiment

Figure 13:
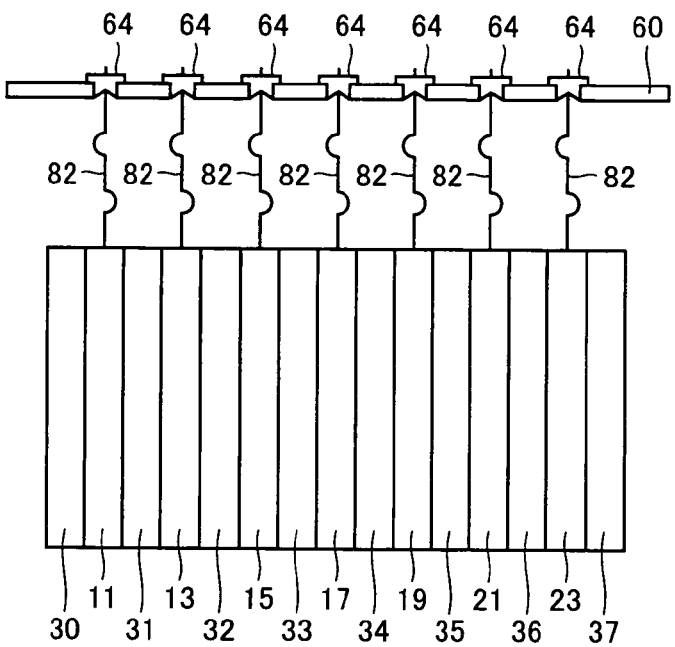
FIG. 13 is a cross section of a semiconductor device according to a second embodiment of the present invention.

FIG. 13 is a cross section of a semiconductor device according to a second embodiment of the present invention. FIG. 13 corresponds to FIG. 3, and does not show a plate spring that presses the semiconductor stack in a direction along which the components thereof are arranged, and a housing that accommodates the semiconductor stack, as in FIG. 3. Referring to FIG. 13, a semiconductor device 1A, which has a configuration of semiconductor device 1 shown in FIG. 3, is provided with a plurality of signal lines 82 instead of the plurality of signal lines 62.

The plurality of signal lines 82 are also made of a conductor such as aluminium or copper, as in the plurality of signal lines 62 in the first embodiment. The plurality of signal lines 82 are made to extend from semiconductor modules 10-23 (semiconductor modules 10, 12, 14, 16, 18, 20, and 22 are not shown, the same applies below), respectively, and connected to the plurality of connectors 64, respectively. The plurality of signal lines 82 transmit a control signal and other various types of signals between control substrate 60 and semiconductor modules 10-23. Each of the plurality of signal lines 82 has two bent portions for preventing warpage of themlselves.

Figure 14:
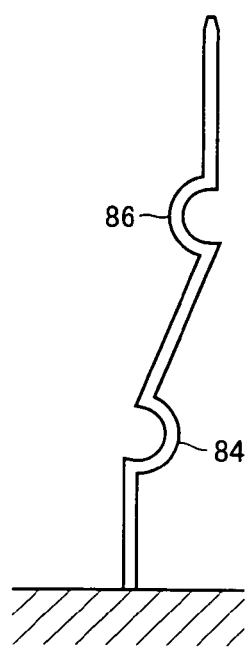
FIG. 14 is an enlarged view of a signal line shown in FIG. 13.

FIG. 14 is an enlarged view of signal line 82 shown in FIG. 13. Referring to FIG. 14, signal line 82 includes bent portions 84, 86. Bent portion 84 allows signal line 82 to be bent in a predetermined direction, while bent portion 86 allows signal line 82 to be bent in a direction approximately opposite to the direction along which bent portion 84 allows signal line 82 to be bent.

Bent portion 84 allows signal line 82 to be bent and thereby corrects misalignment between the tip portion of signal line 82 and fitting portion 65 of connector 64 (not shown). Bent portion 86 allows signal line 82 to be bent in a direction approximately opposite to the direction along which bent portion 84 allow signal line 82 to be bent and thereby corrects an orientation of the tip portion of signal line 82 to a direction along which signal line 82 is inserted into fitting portion 65 of connector 64. Accordingly, the tip portion of signal line 82 is fitted into fitting portion 65 without any warpage of signal line 82.

Other configurations of semiconductor device 1A are similar to those of semiconductor device 1 according to the first embodiment.

Modification of Second Embodiment

Figure 15:
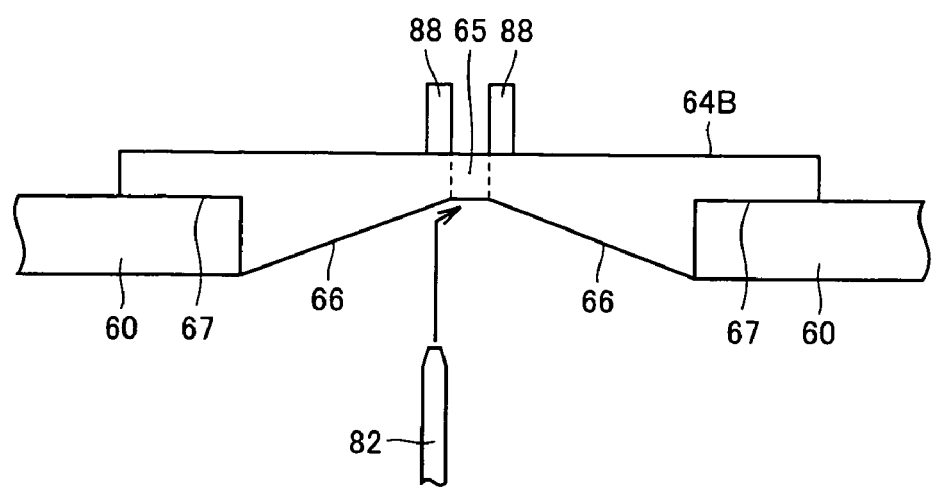
FIG. 15 is an enlarged view of a connector according to a modification of the second embodiment of the present invention.
Figure 16:
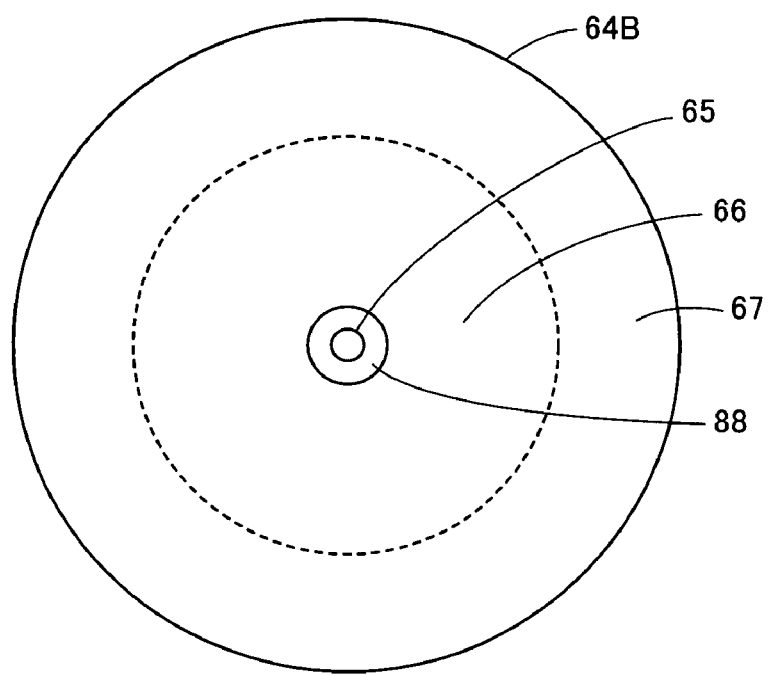
FIG. 16 is a plan view of the connector shown in FIG. 15.

FIG. 15 is an enlarged view of a connector according to a modification of the second embodiment of the present invention. FIG. 16 is a plan view of the connector shown in FIG. 15. Referring to FIGS. 15 and 16, a connector 64B, which has the configuration of connector 64 shown in FIG. 3, further includes a guide portion 88.

Guide portion 88 is provided adjacently to the periphery of fitting hole 65 at a surface opposite to the surface where tapered portion 66 is formed. Guide portion 88 allows the tip portion of signal line 82, which is fitted into fitting hole 65 and protrudes from the rear surface of connector 64, to be directed forcefully to the direction along which signal line 82 is inserted into fitting hole 65.

In other words, if a sufficient thickness of fitting hole 65 is not ensured, and guide portion 88 is not provided, then signal line 82 is fitted into fitting hole 65 in a diagonal direction and warped. However, in the present embodiment, a sufficient thickness of the fitting portion is substantially ensured by guide portion 88, which prevents warpage of signal line 82.

Figure 17:
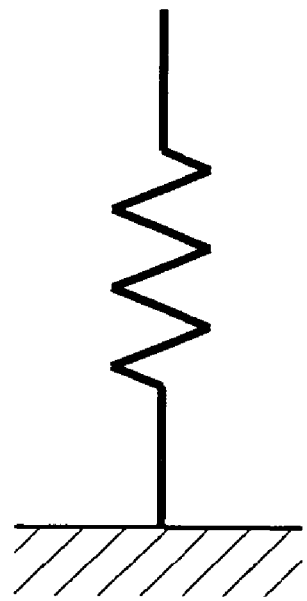
FIG. 17 is a view showing a modification of a signal line according to the second embodiment.
Figure 18:
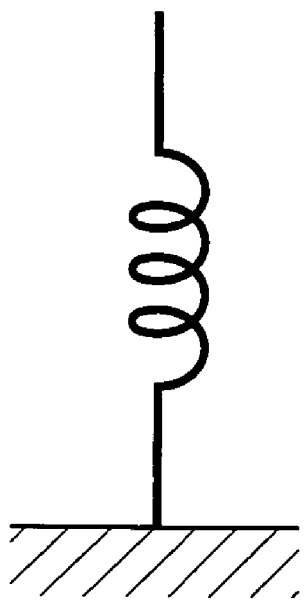
FIG. 18 is a view showing another modification of the signal line according to the second embodiment.

In the description above, signal line 82 has two bent portions. However, signal line 82 may have more than two bent portions. Furthermore, as other modifications of the second embodiment, a signal line may have a spring structure as in a signal line 82A shown in FIG. 17 or a signal line 82B shown in FIG. 18. In other words, the spring structure allows the signal line to be bent in a successive manner, and hence the signal line can be regarded to have substantially more than two bent portions.

As described above, according to the second embodiment and its modifications, bent portion 84 corrects misalignment between the tip portion of signal line 82 and fitting portion 65, while bent portion 86 or guide portion 88 corrects the orientation of the tip portion of signal line 82 to the direction along which signal line 82 is inserted into fitting portion 65. Accordingly, warpage of signal line 82 can be prevented.

In each of the embodiments above, the signal line is made to extend from the semiconductor module and is connected to the control substrate by the connector. However, there may be used a configuration in which the connector is provided at the semiconductor module and serves to connect the signal line, which is made to extend from the control substrate, to the semiconductor module. In other words, the application range of the present invention is not limited by the place where the connector is provided (i.e. the control substrate side or the semiconductor module side).

The semiconductor device according to the present invention is suitable for a vehicle such as a hybrid vehicle or an electric vehicle. As described above, from the viewpoint of space saving and others, it is preferable for the hybrid vehicle or the electric vehicle to have a configuration of semiconductor stack in which semiconductor elements and coolers are alternately arranged. When the hybrid vehicle or the electric vehicle is mass-produced for consumers, reduction in manufacturing cost is more highly demanded, and hence it is necessary to take drastic measures to improve assemblability. The semiconductor device according to the present invention can improve assemblability of the semiconductor stack, and can highly contribute to reduction in manufacturing cost of a hybrid vehicle or an electric vehicle.

In each of the embodiments described above, there have been described a semiconductor device having a configuration of a semiconductor stack in which a plurality of semiconductor modules and a plurality of coolants are alternately stacked. However, as shown in FIGS. 19 and 20, the present invention can be applied to the case where a plurality of semiconductor modules are arranged in a plane.

Figure 19:
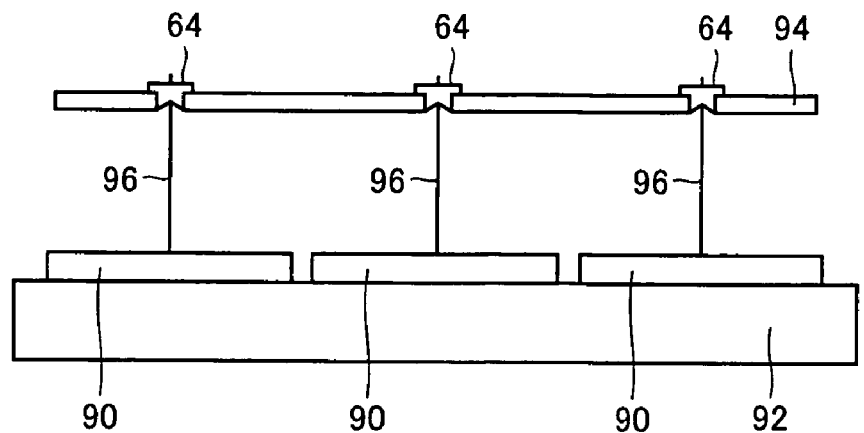
FIG. 19 is a side view of a semiconductor device in which a plurality of semiconductor modules are arranged in a plane.

FIG. 19 is a side view of a semiconductor device in which a plurality of semiconductor modules are arranged in a plane. Referring to FIG. 19, a semiconductor device 2 includes a plurality of semiconductor modules 90, a cooler 92, a control substrate 94, a plurality of signal lines 96, and a plurality of connectors 64.

The plurality of semiconductor modules 90 are arranged in a plane on cooler 92. Cooler 92 cools the plurality of semiconductor modules 90. Control substrate 94 is disposed along and above the plurality of semiconductor modules 90. The plurality of signal lines 96 are made to extend from the upper surfaces of the plurality of semiconductor modules 90 to control substrate 94, respectively, and connected to the plurality of connectors 64, respectively.

Figure 20:
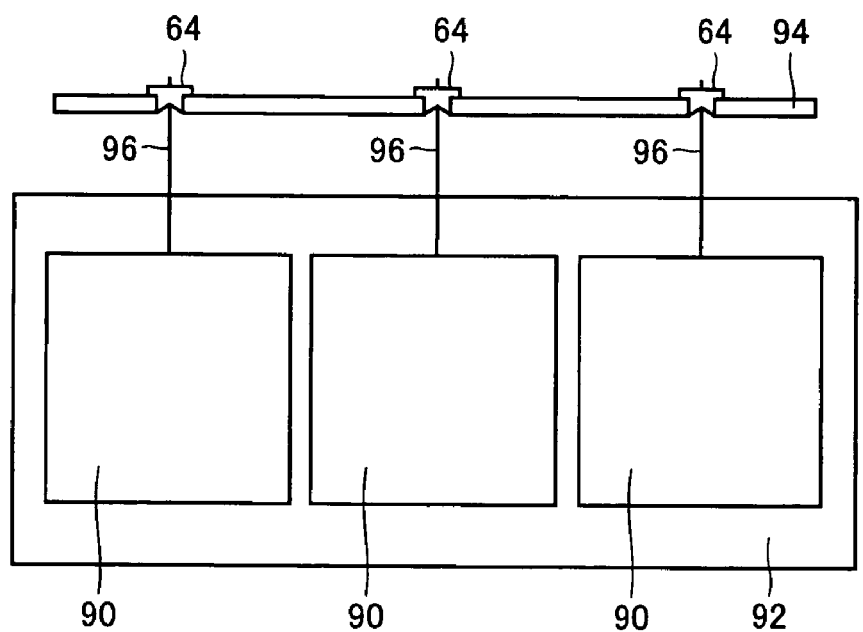
FIG. 20 is a plan view of another semiconductor device in which a plurality of semiconductor modules are arranged in a plane.

FIG. 20 is a plan view of another semiconductor device in which a plurality of semiconductor modules are arranged in a plane. Referring to FIG. 20, a semiconductor device 2A, which has the configuration of semiconductor device 2 shown in FIG. 19, allows control substrate 94 to be disposed along and lateral to the plurality of semiconductor modules 90. The plurality of signal lines 96 are made to extend from the side of the plurality of semiconductor modules 90 to control substrate 94, respectively, and connected to the plurality of connectors 64, respectively.

As in the case where the plurality of semiconductor modules 90 are arranged in a plane, misalignment can occur between connector 64 disposed at a prescribed position of control substrate 94 and signal line 96 extending from each of semiconductor modules 90, because of design tolerances, positional errors in arrangement, and others of semiconductor modules 90. However, according to semiconductor devices 2, 2A, the tip portion of signal line 96 is led to fitting portion 65 of corresponding connector 64, thereby improving assemblability. Connectors 64A, 64B may be provided instead of connector 64, while signal lines 62A-62D, 82, 82A, and 82B may be provided instead of signal line 96.

In the description above, connectors 64, 64A, and 64B correspond to the "connecting member" according to the present invention, and each of tapered portion 66 and magnetized portion 68 corresponds to the "leading portion" according to the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a plurality of arranged semiconductor modules;
   a control device disposed along said plurality of arranged semiconductor modules and driving said plurality of semiconductor modules;
   a plurality of signal lines having one end connected to said plurality of semiconductor modules and another end connected to said control device; and
   a plurality of connecting members connecting said plurality of signal lines to either of said control device and said plurality of semiconductor modules, respectively, wherein
   each of said plurality of connecting members includes:
   a fitting portion formed to be fitted to the corresponding signal line, and
   a leading portion formed to lead a tip portion of said corresponding signal line to said fitting portion.

2. The semiconductor device according to claim 1, wherein said leading portion has a tapered shape formed in a periphery of said fitting portion and tilted from a peripheral portion of the leading portion to said fitting portion in a direction along which said corresponding signal line is inserted.

3. The semiconductor device according to claim 1, wherein said leading portion has a magnetized portion formed adjacently to a periphery of said fitting portion and generating attractive force toward the tip portion of said corresponding signal line.

4. The semiconductor device according to claim 3, wherein the tip portion of each of said plurality of signal lines is magnetized to generate attractive force toward said magnetized portion.

5. The semiconductor device according to claim 1, wherein the tip portion of each of said plurality of signal lines has a tapered shape.

6. The semiconductor device according to claim 1, further comprising a guide portion formed to lead the tip portion of said corresponding signal line along a direction along which said corresponding signal line is inserted, said corresponding signal line penetrating said fitting portion.

7. The semiconductor device according to claim 1, wherein each of said plurality of signal lines has at least two bent portions.

8. The semiconductor device according to claim 1, wherein a direction along which said plurality of signal lines are made to extend is different from a direction along which said plurality of arranged semiconductor modules are stacked.

9. The semiconductor device according to claim 8, wherein the direction along which said plurality of signal lines are made to extend is approximately perpendicular to the direction along which said plurality of arranged semiconductor modules are stacked.

10. The semiconductor device according to claim 1, wherein the plurality of semiconductor modules are co-planar with and spaced apart from the control device.

* * * * *